(12) United States Patent
Hwang

(10) Patent No.: US 9,191,011 B2
(45) Date of Patent: Nov. 17, 2015

(54) DOUBLE DATA RATE COUNTER, AND ANALOG-DIGITAL CONVERTING APPARATUS AND CMOS IMAGE SENSOR USING THE SAME

(71) Applicant: SK hynix Inc., Gyeonggi-do (KR)

(72) Inventor: Won-Seok Hwang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 258 days.

(21) Appl. No.: 14/052,313

(22) Filed: Oct. 11, 2013

(65) Prior Publication Data
US 2014/0367551 A1 Dec. 18, 2014

(30) Foreign Application Priority Data

Jun. 14, 2013 (KR) ........................ 10-2013-0068435

(51) Int. Cl.
| | | |
|---|---|---|
| *H03M 1/56* | (2006.01) | |
| *H03K 21/02* | (2006.01) | |
| *H04N 5/378* | (2011.01) | |
| *H03K 21/38* | (2006.01) | |
| *H03M 1/12* | (2006.01) | |

(52) U.S. Cl.
CPC .............. *H03K 21/026* (2013.01); *H03K 21/38* (2013.01); *H03M 1/123* (2013.01); *H03M 1/56* (2013.01); *H04N 5/378* (2013.01)

(58) Field of Classification Search
CPC ...... H03M 1/56; H03M 1/123; H02K 21/026; H02K 21/38; H04N 5/378
USPC .................................................. 341/155, 169
See application file for complete search history.

(56) References Cited

U.S. PATENT DOCUMENTS

| | | | | |
|---|---|---|---|---|
| 7,292,177 | B2 * | 11/2007 | Muramatsu et al. .......... | 341/164 |
| 7,629,914 | B2 * | 12/2009 | Muramatsu et al. .......... | 341/164 |
| 7,990,304 | B2 | 8/2011 | Lim et al. | |
| 8,115,845 | B2 * | 2/2012 | Koh et al. ..................... | 348/303 |
| 8,395,539 | B2 * | 3/2013 | Lim et al. ...................... | 341/169 |
| 8,976,052 | B2 * | 3/2015 | Kim et al. ..................... | 341/155 |
| 2010/0225796 | A1 | 9/2010 | Lim et al. | |

* cited by examiner

Primary Examiner — Khai M Nguyen
(74) Attorney, Agent, or Firm — IP & T Group LLP

(57) ABSTRACT

A double data rate (DDR) counter includes a clock selection unit suitable for selectively inverting a first counting clock based on a control signal and for outputting a second counting clock, a first latch stage suitable for latching the second counting clock based on a counting enable signal and for outputting the least significant bit (LSB) of the DDR counter, a determination unit suitable for generating the control signal based on the last bit state of the LSB in a reset counting period, and a second latch stage suitable for receiving the LSB as a clock input to generate a higher bit of the LSB at least in a main counting period.

17 Claims, 7 Drawing Sheets

DOUBLE DATA RATE COUNTER, AND ANALOG-DIGITAL CONVERTING APPARATUS AND CMOS IMAGE SENSOR USING THE SAME

CROSS-REFERENCE TO RELATED APPLICATIONS

The present application claims priority of Korean Patent Application No. 10-2013-0068435, filed on Jun. 14, 2013, which is incorporated herein by reference in its entirety.

BACKGROUND

1. Field

Exemplary embodiments of the present invention relate to an integrated circuit design, and more particularly, to a double data rate (DDR) counter, an analog-digital converter, and a CMOS image sensor using the same.

2. Description of the Related Art

In general, an analog-digital converter (ADC) may be used for various electronic devices to convert a valid physical parameter, such as intensity of light, intensity of sound, or time, into a digital signal.

For example, an image sensor acquires an image by using the properties of semiconductor responding to incident light, and includes an analog-digital converter to convert an analog signal outputted from a pixel array into a digital signal. The analog-digital converter includes a counter to perform a counting operation using a clock.

Meanwhile, the operating speed and power consumption of the counter have a direct effect on the performance of a device or system including the counter. In particular, a CMOS image sensor may include a plurality of counters to convert analog signals, which are outputted in the unit of column from an active pixel sensor array, into digital signals. The number of counters may be increased depending on the resolution of the CMOS image sensor. As the number of counters increases, the operating speed and power consumption of the counter may serve as an important factor to determine the entire performance of the image sensor.

Thus, a double data rate (DDR) counter is proposed to reduce the power consumption in a CMOS image sensor using a single-slope ADC. The DDR counter may realize the same resolution while reducing counter speed to the half. Furthermore, the DDR counter may apply a digital double sampling (DDS) technique to remove an offset by using output codes of a reset voltage and a signal voltage, respectively.

However, in order to implement the conventional DDR counter, the number of peripheral circuits, such as flip-flops and multiplexers, may increases. With the increase in number of the peripheral circuits, circuit complexity inevitably increases. As a result, the power consumption of the counter may be increased, and the operating speed of the counter may be reduced.

SUMMARY

Various embodiments of the invention are directed to a DDR counter that may reduce power consumption and increase operating speed by using a simple circuit, and an analog-digital converter and a CMOS image sensor using the same.

Other embodiments of the invention are directed to a DDR counter, which utilizes a sampled clock as the least significant bit (LSB) of the counter and determines the state of the sampled clock, which is to be used as the LSB of the counter in a main counting period based on the LSB of a reset counting period, so that counting is continuously performed from the reset counting period to the main counting period, and an analog-digital converter and a CMOS image sensor using the same.

In an embodiment, a double data rate (DDR) counter may include a clock selection unit suitable for selectively inverting a first counting clock based on a control signal and for outputting a second counting clock, a first latch stage suitable for latching the second counting clock based on a counting enable signal and for outputting the least significant bit (LSB) of the DDR counter, a determination unit suitable for generating the control signal based on the last bit state of the LSB in a reset counting period, and a second latch stage suitable for receiving the LSB as a clock input to generate a higher bit of the LSB at least in a main counting period.

In an embodiment, an analog-digital converter may include a comparator suitable for comparing an analog signal with a reference signal and for generating a comparator output signal, and a DDR counter suitable for performing a counting operation on the comparator output signal based on a clock and for generating a digital signal corresponding to the analog signal. The DDR counter may include an inversion unit suitable for selectively inverting the comparator output signal in the reset counting period based on an inversion selection signal and for outputting a counting enable signal, a counting clock generation unit suitable for generating a first counting clock based on the clock, the counting enabling signal, and a counter start signal, a clock selection unit suitable for selectively inverting the first counting clock based on a control signal and for outputting the second counting clock, a first latch stage suitable for outputting the second counting clock based on the counting enable signal and for outputting the least significant bit (LSB) of the DDR counter, a determination unit suitable for generating the control signal based on the last bit state of the LSB in the reset counting period, and a second latch stage suitable for receiving the LSB as a clock input to generate a higher bit of the LSB at least in a main counting period.

In an embodiment, a CMOS image sensor may include a pixel array suitable for generating an analog signal corresponding to incident light, a plurality of comparators, each suitable for comparing the analog signal with a ramp signal and for generating a comparator output signal, a plurality of DDR counters, each suitable for performing a counting operation on the corresponding comparator output signal based on a clock provided from the control unit and for generating a digital signal corresponding to the analog signal, and a control unit suitable for controlling the operations of the pixel array, the comparators, and DDR counters. Each of the DDR counter may include an inversion unit suitable for selectively inverting the corresponding comparator output signal in the reset counting period based on an inversion selection signal provided from the control unit and for outputting a counting enable signal, a counting clock generation unit suitable for generating a first counting clock based on the clock, the counting enabling signal, and a counter start signal provided from the control unit, a clock selection unit suitable for selectively inverting the first counting clock based on a control signal and for outputting the second counting clock, a first latch stage suitable for outputting the second counting clock on the counting enable signal and for outputting the least significant bit (LSB) of the corresponding DDR counter, a determination unit suitable for generating the control signal based on the last bit state of the LSB in a reset counting period, and a second latch stage suitable for receiving the LSB as a clock input to generate a higher bit of the LSB at least in a main counting period.

DETAILED DESCRIPTION

Figure 1:
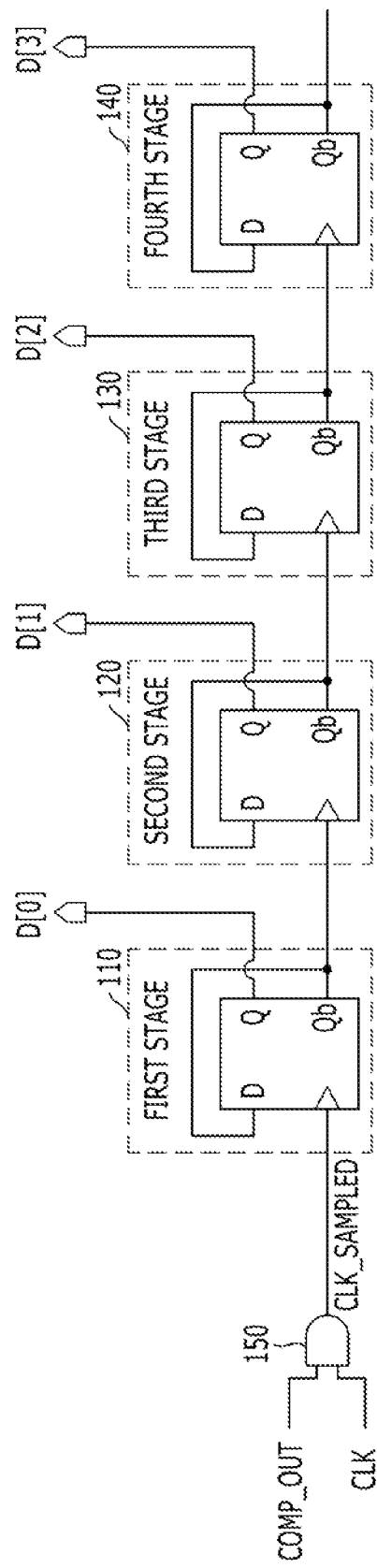
FIG. 1 is a circuit diagram illustrating a ripple counter.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention.

In this disclosure, when one part is referred to as being 'connected' to another part, it should be understood that the former can be 'directly connected' to the latter, or 'electrically connected' to the latter via an intervening part. Furthermore, when it is described that one comprises (or includes or has) some elements, it should be understood that it may comprise (or include or has) only those elements, or it may comprise (or include or have) other elements as well as those elements if there is no specific limitation. The terms of a singular form may include plural forms unless referred to the contrary.

In the following embodiments of the present invention, a single-slope ADC will be taken as an example for description. However, the present invention may be applied to a multi-slope ADC or an apparatus requiring a DDR counter. Thus, the present invention is not limited to the single-slope ADC.

FIG. 1 is a circuit diagram illustrating a ripple counter.

For example, a basic structure of a counter of a single-slope ADC is based on a ripple counter, and the ripple counter counts a pulse period by using a clock.

Referring to FIG. 1, the ripple counter includes first to fourth stages 110 to 140 coupled in series.

The ripple counter may include latch (or flip-flop) stages based on the bit number of a digital signal corresponding to a counting result. FIG. 1 illustrates the ripple counter including four latch stages, that is, the first to fourth stages 110 to 140, for convenience of description. The number of the latch stages included in the ripple counter may be changed corresponding to the bit number of a binary code. FIG. 1 illustrates that the ripple counter generates four bit signals D[0], D[1], D[2], and D[3], that is, a four-bit binary code D[0:3].

The ripple counter has a cascade structure in which the plurality of stages 110 to 140 are sequentially toggled by output signals of previous stages, respectively. That is, the first stage 110 is toggled in response to a signal inputted to a clock terminal thereof, the second stage 120 is toggled in response to an output signal of the first stage 110, which is inputted to a clock terminal thereof, the third stage 130 is toggled in response to an output signal of the second stage 120, which is inputted to a clock terminal thereof, and the fourth stage 140 is toggled in response to an output signal of the third stage 130, which is inputted to a clock terminal thereof. In this way, the bit signals D[0], D[1], D[2], and D[3] of which the cycles are sequentially doubled are generated. Here, the signal inputted to the clock terminal of the first stage 110 may be obtained by performing an AND operation on a comparator output signal COMP_OUT (i.e., a counting enable signal, a counting period signal, or a clock sampling signal) and a clock CLK. A NAND gate 150 receives the comparator output signal COMP_OUT and the clock CLK and perform an AND operation on the signals, so that a sampled clock CLK_SAMPLED corresponding to the pulse period of the comparator output signal COMP_OUT may be obtained.

Figure 2:
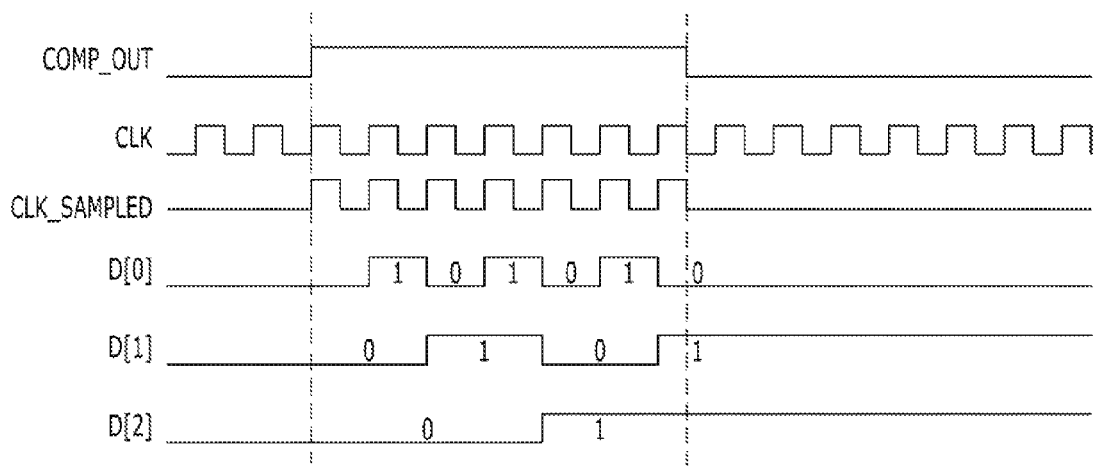
FIG. 2 is a timing diagram of the ripple counter shown in FIG. 1.
Figure 3:
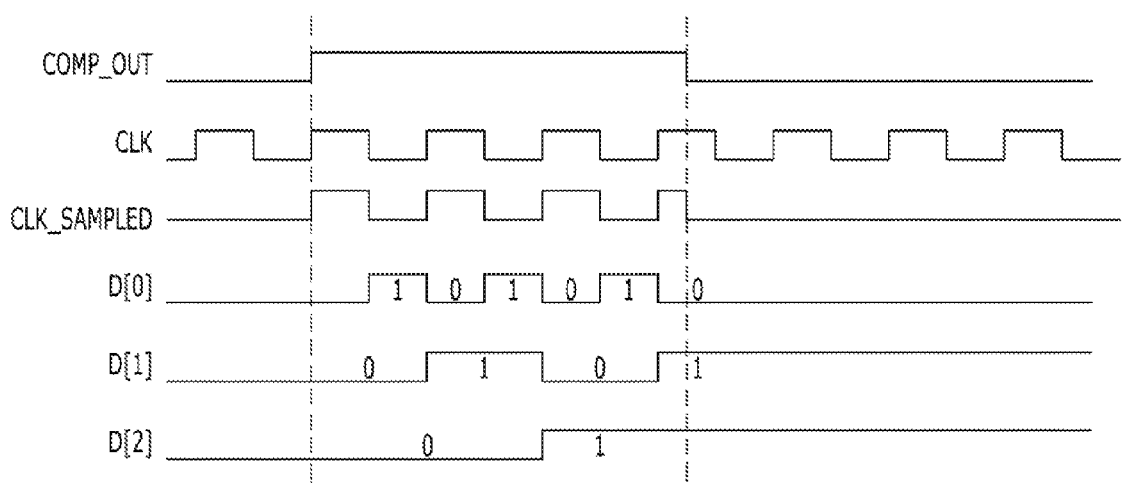
FIG. 3 is an expected timing diagram of a DDR counter.

FIG. 2 is a timing diagram of the ripple counter shown in FIG. 1. Further, FIG. 3 is an expected timing diagram of a DDR counter. For reference, for convenience of description, only the first to third bit signals D[0], D[1], and D[2] are illustrated in FIGS. 2 and 3.

Referring to FIG. 2, the first bit signal D[0] generated from the first stage 110 is toggled in response to a rising edge of the clock CLK, and the second and third bit signals D[1] and D[2] generated from the second and third stages 120 and 130 are toggled in response to falling edges of output signals of the previous stages, for example, adjacent lower bit signals, respectively. That is, the second bit signal D[1] is toggled in response to a falling edge of the first bit signal D[0], and the third bit signal D[2] is toggled in response to a falling edge of the second bit signal D[1]. As a result, the first to third bit signals D[0], D[1], and D[2] have the cycles, which are sequentially doubled.

Referring to FIG. 3, the DDR counter has the same counting speed with the ripple counter while having a clock frequency corresponding to ½ of the clock frequency of the clock CLK shown in FIG. 2. That is, since the DDR counter performs counting two times in each cycle of the clock CLK, the DDR counter may operate with an operating speed two times higher than the ripple counter.

Figure 4:
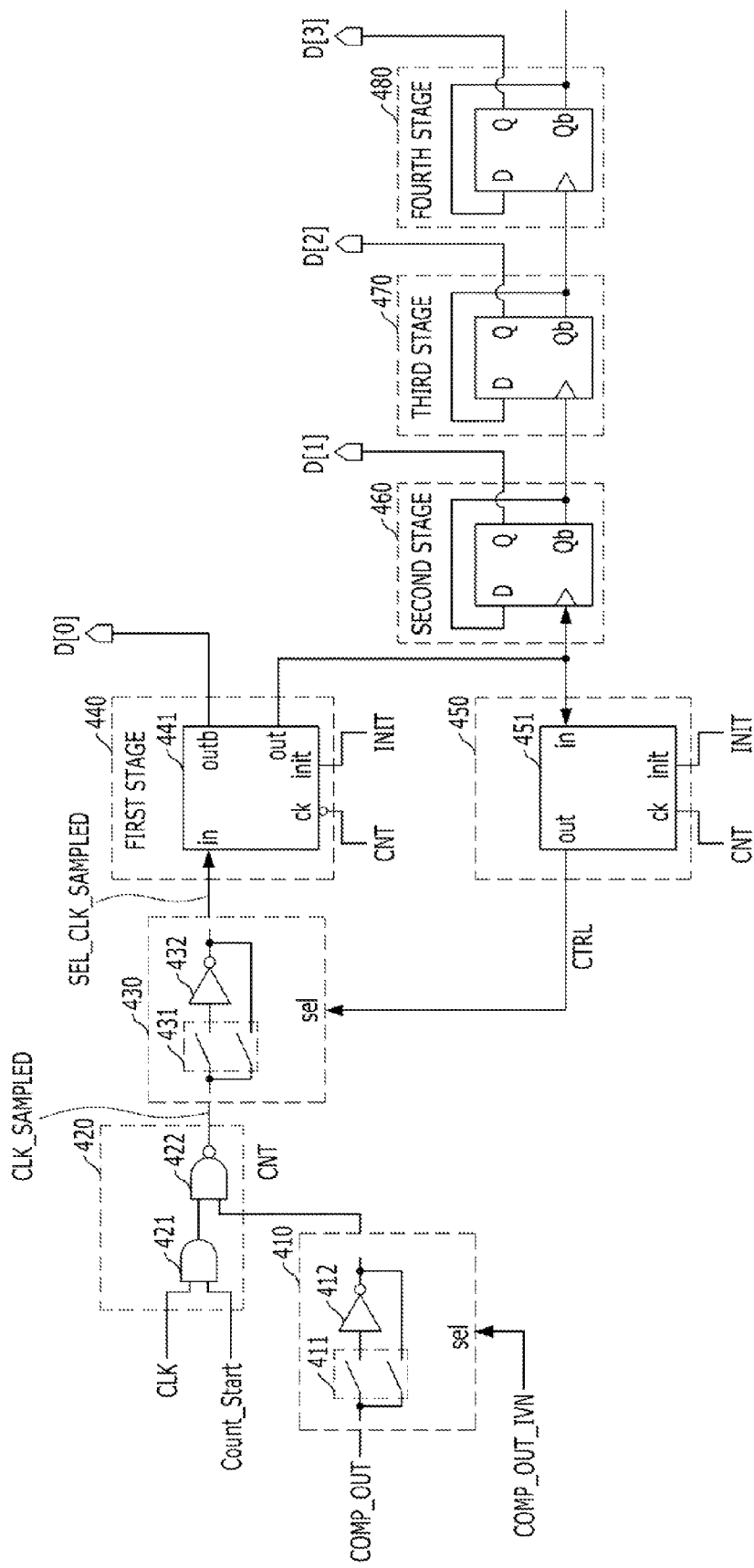
FIG. 4 is a circuit diagram of a DDR counter in accordance with an embodiment of the present invention.
Figure 5:
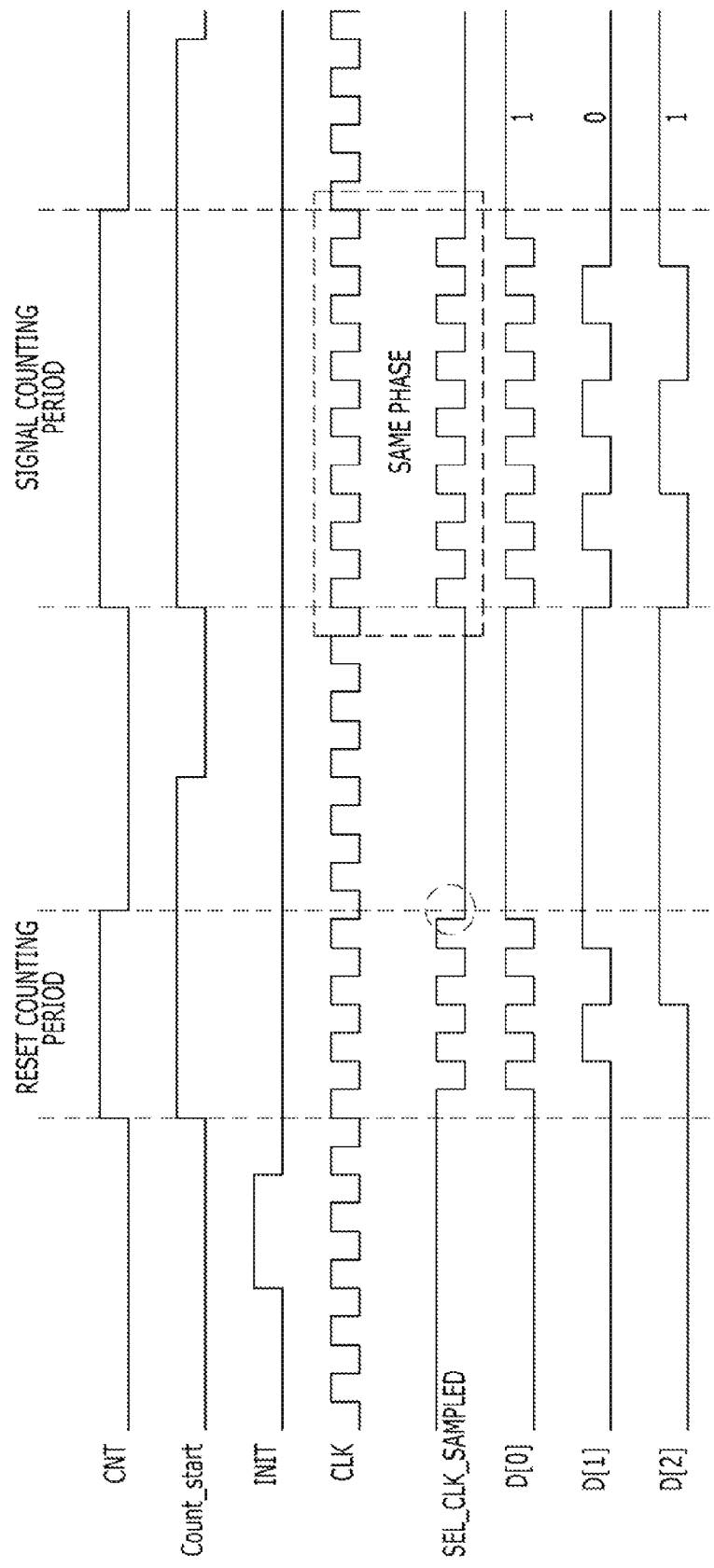
FIGS. 5 and 6 are timing diagrams of the DDR counter shown in FIG. 4.
Figure 6:
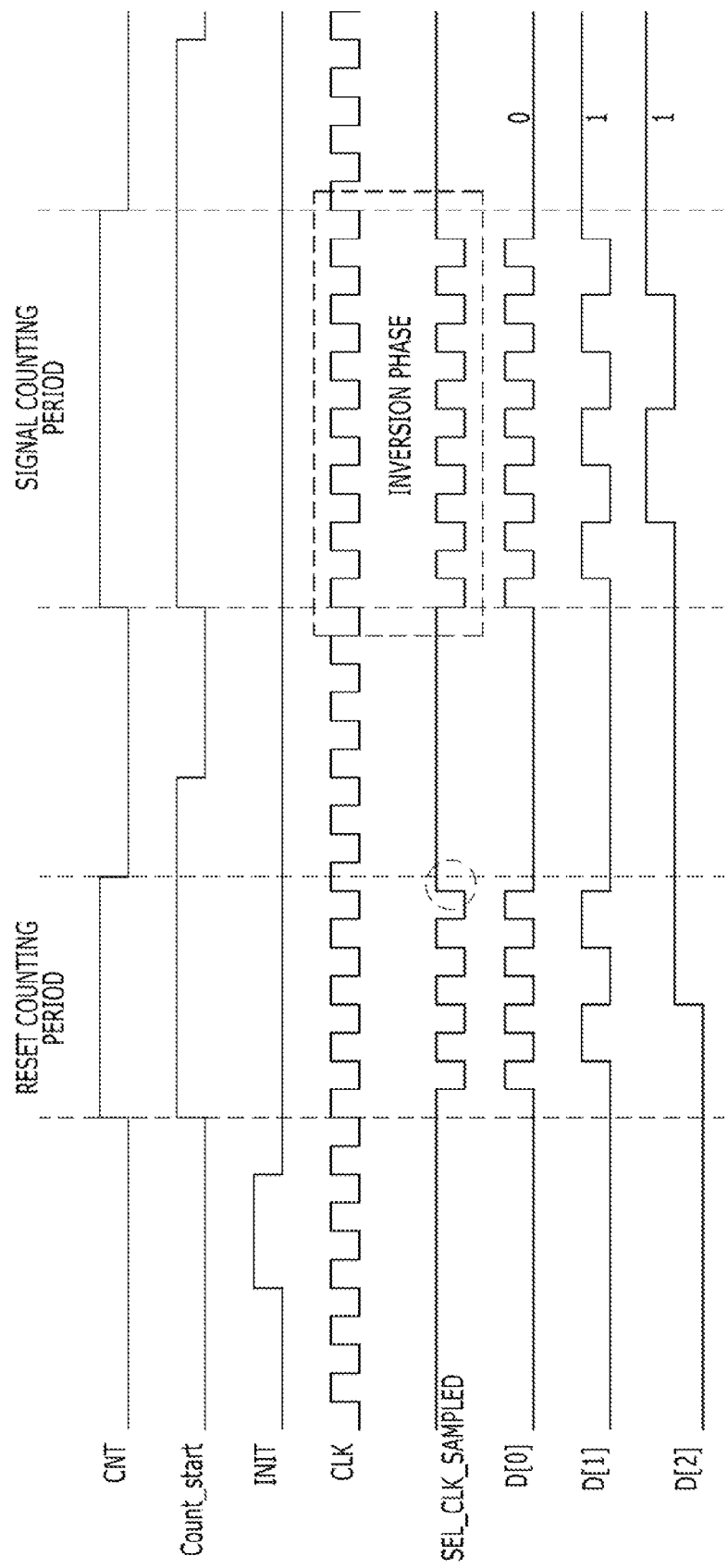

FIG. 4 is a circuit diagram of a DDR counter in accordance with an embodiment of the present invention. FIG. 5 is a timing diagram when the least significant bit (LSB) of the DDR counter is at a low state shown in FIG. 4. FIG. 6 is a timing diagram when the LSB of the DDR counter is at a high state in the DDR counter shown in FIG. 4.

For example, a counter of a single-slope ADC using digital double sampling (DDS) technique counts a reset voltage value from a pixel array, counts a signal voltage value based on the reset level, and generates a difference therebetween. Here, the counting operation may be realized through an up/down counting method or only an up counting method. When only the up counting method is used, two counting periods including a reset counting period and a signal counting period (i.e., a main counting period) must be consecutively counted.

The counter in accordance with the embodiment of the present invention utilizes a second counting clock SEL_CLK_SAMPLED as the LSB of the counter, for a DDR counting operation. Furthermore, in order to implement the DDS through the up counting method, a counting value of the reset counting period is latched until the signal counting period such that counting is consecutively performed.

Referring to FIG. 4, the DDR counter in accordance with the embodiment of the present invention includes a clock selection unit 430, a first stage 440, a determination unit 450, and a second stage 460. The clock selection unit 430 may invert or non-invert a first counting clock (i.e., a sampled clock) CLK_SAMPLED generated from a counting clock generation unit 420 based on a control signal CTRL from the determination unit 450, and output a second counting clock (i.e., the inverted or non-inverted first counting clock) SEL_CLK_SAMPLED to the first stage 440. The first stage 440 may output the second counting clock SEL_CLK_SAMPLED from the clock selection unit 430 as the LSB of the counter. The determination unit 450 may generate the control signal CTRL based on the last bit state of the output bit of the first stage 440 in the reset counting period (i.e., based on the last bit state of the LSB in the reset counting period). The second stage 460 may receive an output bit of the first stage 440 as a clock and operate as a ripple counter.

The clock selection unit 430 may include a switch 431 and an inverter 432. The switch 431 may select a pass path or inversion path according to the control signal CTRL from the determination unit 450, and the inverter 432 may invert the counting clock provided from the counting clock generation unit 420 as the inversion path is selected by the switch 431. The clock selection unit 430 selects the pass path when the control signal CTRL from the determination unit 450 has a value of '0'. Then, the inverter 432 does not invert the counting clock provided from the counting clock generation unit 420, but passes the counting clock to output the second counting clock SEL_CLK_SAMPLED to an input terminal of the first stage 440. When the control signal CTRL from the determination unit 450 has a value of '1', the switch 431 selects the inversion path. Then, the inverter 432 inverts the counting clock provided from the counting clock generation unit 420 and outputs the select signal SEL_CLK_SAMPLED to the input terminal of the first stage 440.

The first stage 440 may include a first latch 441 configured to latch the second counting clock from the clock selection unit 430 and output the latched clock as the LSB of the counter. Here, the first latch 441 may be implemented with a controlled latch. The controlled latch operates as a latch during a period in which the clock is in a logic high level, and operates as a general buffer during a period in which the clock is in a logic low level. Furthermore, the controlled latch may define an initial state. Thus, the first latch 441 is initialized in response to an initialization signal INIT inputted to an initialization terminal, and operates at a falling edge of a counting enable signal CNT inputted to a clock terminal from an inversion unit 410 so as to latch the second counting clock from the clock selection unit 430. Then, the first latch 441 outputs the LSB D[0] of the counter to a negative output terminal, and outputs an output bit to a positive output terminal.

The determination unit 450 may include a second latch 451 that may generate the control signal CTRL denoting whether or not to invert the first counting clock CLK_SAMPLED and to output the second counting clock SEL_CLK_SAMPLED, based on the last bit state of the output bit of the first stage 440 in the reset counting period. Here, the second latch 451 may be implemented with a controlled latch. The controlled latch operates as a latch during a period in which the clock is in a logic high level, and operates as a general buffer during a period in which the clock is in a logic low level. Furthermore, the controlled latch may define an initial state. Thus, the second latch 451 is initialized according to an initialization signal INIT inputted to an initialization terminal, and operates at a rising edge of the counting enable signal CNT inputted to a clock terminal from the inversion unit 410 so as to receive an output bit from the second output terminal of the first latch 441 through an input terminal. Then, the second latch 451 determines whether or not to invert the first counting clock SEL_CLK_SAMPLED and outputs the second counting clock SEL_CLK_SAMPLED, based on the last bit state of the output bit of the first stage 440, and outputs the control signal CTRL corresponding to the determination result to a control terminal of the clock selection unit 430 through an output terminal.

Referring to FIGS. 5 and 6, the determination unit 450 determines the state of the second counting clock SEL_CLK_SAMPLED to be used as an input clock of the first stage 440 in the signal counting period, based on the last bit state of the second counting clock SEL_CLK_SAMPLED, that is, the last bit state of the output bit (LSB) of the first stage 440 in the reset counting period. For example, a high/low value of the LSB, when the counting enable signal CNT is changed from a high level to a low level during the reset counting period. Then, the determination unit 450 outputs the control signal CTRL corresponding to the determination result to the dock selection unit 430.

Referring to FIG. 5, when the counting enable signal CNT is changed from a high level to a low level during the reset counting period, the second counting clock SEL_CLK_SAMPLED to be used as an input clock of the first stage 440 is non-inverted (same phase) because the last bit state of the second counting clock SEL_CLK_SAMPLED is in a logic low level. Since the second counting clock is outputted as an output bit from the first stage, the second counting clock has the same bit state as the LSB of the reset counting period among the output bits.

Referring to FIG. 6, when the counting enable signal CNT is changed from a high level to a low level during the reset counting period, the second counting clock SEL_CLK_SAMPLED to be used as an input clock of the first stage 440 is inverted because the last bit state of the second counting clock SEL_CLK_SAMPLED is in a logic high level, thereby connecting the reset counting period and the signal counting period. Since the second counting clock is outputted as an output bit from the first stage, the second counting clock has the same bit state as the LSB of the reset counting period among the output bits.

The second stage 460 may receive an output bit from the first stage 440 through a clock terminal thereof and operate as a ripple counter. That is, the second stage 460 toggles in response to the output bit from the first stage 440, which is inputted to the clock terminal.

The DDR counter in accordance with the embodiment of the present invention further includes a inversion unit 410 that may invert a comparator output signal (i.e., a basic counting enable signal, a counting period signal, or a clock sampling signal) COMP_OUT in a reset period pulse based on an inversion selection signal COMP_OUT_IVN from a control unit (not illustrated in FIG. 4), and output the counting enable signal CNT to the counting clock generation unit 420. Here, the inversion unit 410 may include a switch 411 and an inverter 412. The switch 411 may select a pass path or inversion path based on the inversion selection signal COMP_OUT_IVN from the control unit (not illustrated in FIG. 4), and the inverter 412 may invert the reset period pulse of the comparator output signal COMP_OUT as the inversion path is selected by the switch 411.

The DDR counter in accordance with the embodiment of the present invention further includes the counting clock generation unit 420 that may generate a first counting clock CLK_SAMPLED using a clock CLK and a counter start signal Count_start from the control unit (not illustrated in FIG. 4) and the counting enable signal from the inversion unit 410, and output the generated clock to the clock selection unit 430. Here, the counting clock generation unit 420 may include an AND gate 421 and a NAND gate 422. The AND gate 421 may perform an AND operation on the clock CLK and the counter start signal Count_start from the control unit, and the NAND gate 422 may perform a NAND operation on an output signal of the AND gate 421 and the counting enable signal CNT from the inversion unit 410.

The DDR counter in accordance with the embodiment of the present invention further includes a plurality of stages where each may receive an output bit of an upper stage as a clock and operate as a ripple counter. That is, the DDR counter further includes a third stage 470 that may receive an output bit of the second stage 460 as a clock and operate as a ripple counter and a fourth stage 480 that may receive an output bit of the third stage 470 as a clock and operate as a ripple counter. The DDR counter may include a larger number of stages according to the bit number of a digital signal. At this time, the third stage 470 is toggled in response to the output bit of the second stage 460, which is inputted to a clock terminal thereof, and the fourth stage 480 is toggled in response to the output bit of the third stage 470, which is inputted to a clock terminal thereof.

Since the DDR counter in accordance with the embodiment of the present invention has an operating speed two times higher than a typical counter, the DDR counter may provide a binary code increased by one bit with respect to a clock having the same period and the same counting time. Thus, the DDR counter may provide a more precise counting value by controlling the slope of a ramp signal. Furthermore, although the DDR counter uses a clock of which the frequency is reduced by half, that is, a clock of which the cycle is doubled, the DDR counter may provide a counting value having the same magnitude within the same time as a typical ripple counter. Thus, the DDR counter in accordance with the embodiment of the present invention may reduce power consumption according to the reduction in frequency of the clock, and may increase the operating margin of the counter and a device or system including the same.

Figure 7:
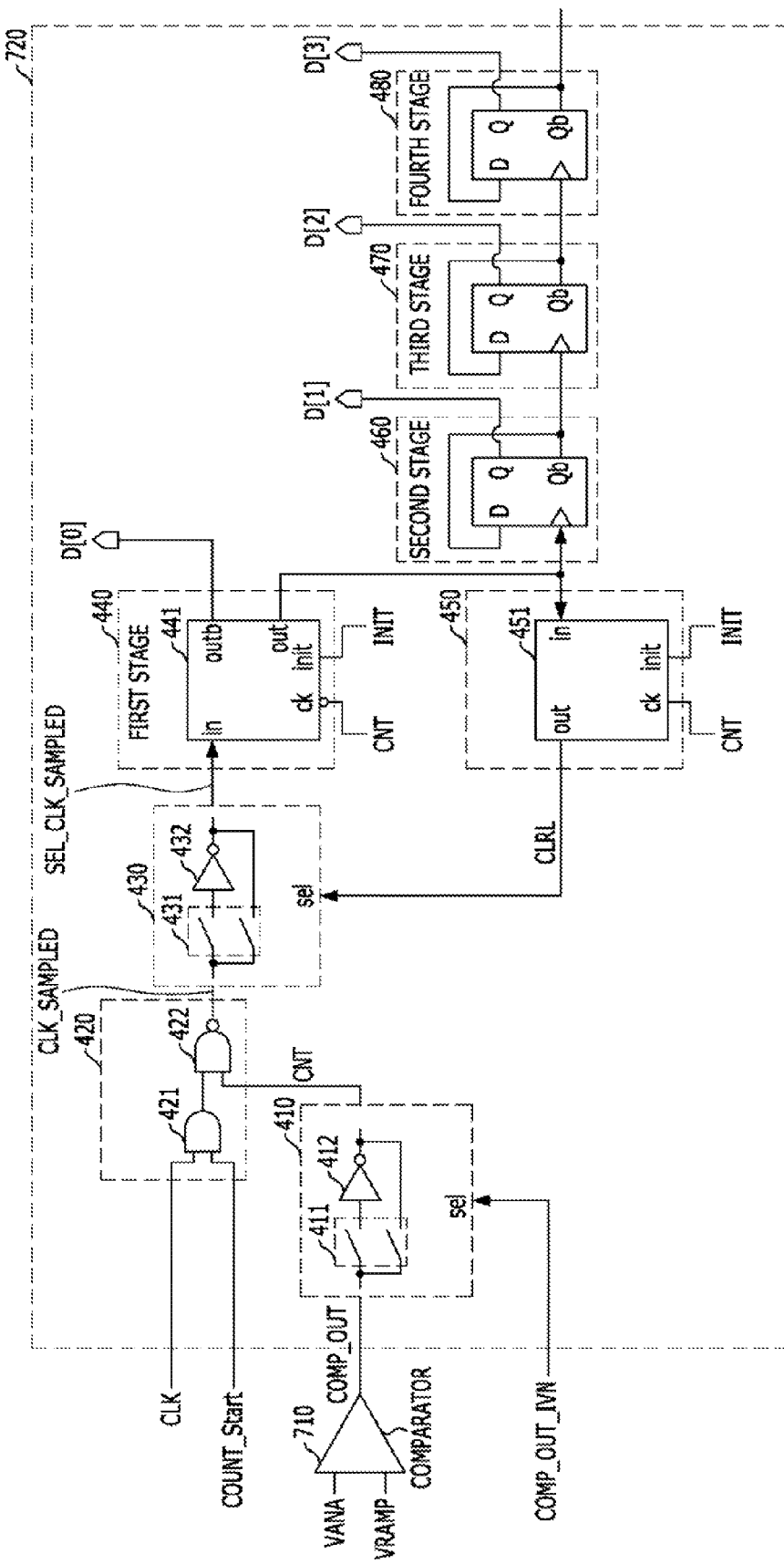
FIG. 7 is a circuit diagram illustrating an analog-digital converter in accordance with an embodiment of the present invention.

FIG. 7 is a configuration diagram of an analog-digital converter in accordance with an embodiment of the present invention.

Referring to FIG. 7, the analog-digital converter in accordance with the embodiment of the present invention includes a comparator 710 and a DDR counter 720.

The comparator 710 may compare an input analog signal VANA with a reference signal VRAMP and generate a comparator output signal COM_OUT. The analog signal VANA may indicate an arbitrary valid physical parameter, such as intensity of light, intensity of sound, or time, and the physical parameter, may correspond to the voltage level of the analog signal. In this case, the reference signal VRAMP may be provided as a ramp signal, which rises or falls with a constant slope, in order to compare the voltage level of the analog signal. The comparator 710 may compare the voltage level of the analog signal VANA to the reference signal, that is, the voltage level of the ramp signal, and generate the comparator output signal COMP_OUT, which changes when the voltage levels are equalized.

As a result, the physical parameter indicated by the voltage level of the analog signal VANA is expressed as the transition time of the comparator output signal COMP_OUT, that is, a quantity of time. For example, when the comparator output signal COMP_OUT changes to a logic low level may indicate an end time point of the counting operation.

The DDR counter 720 may perform a counting operation on the comparator output signal COMP_OUT based on a clock CLK and generate a digital signal D[0], D[1], D[2], and D[3] corresponding to the analog signal. The DDR counter 720 includes a clock selection unit 430, a first stage 440, a determination unit 450, and a second stage 460. The DDR counter 720 may further include third and fourth stages 470 and 480 and additional stages according to the bit number of the digital signal corresponding to the counting result. The DDR counter 720 may further include an inversion unit 410 and a counting clock generation unit 420.

The inversion unit 410 selectively inverts the comparator output signal COMP_OUT in a reset period pulse based on an inversion selection signal COMP_OUT_IVN from a control unit (not illustrated), and outputs a counting enable signal CNT to the counting clock generation unit 420. The counting clock generation unit 420 generates a first counting clock CLK_SAMPLED using a clock CLK and a counter start signal Count_start from the control unit and the counting enable signal CNT from the inversion unit 410, and outputs the generated clock to the clock selection unit 430. The clock selection unit 430 inverts or non-inverts the counting clock provided from the counting clock generation unit 420 according to a control signal CTRL from the determination unit 450, and outputs a second counting clock SEL_CLK_SAMPLED to the first stage 440. The first stage 440 outputs the second counting clock from the clock selection unit 430 as the LSB of the counter. The determination unit 450 outputs the control signal CTRL to the clock selection unit 430 based on the last bit state of the LSB in a reset counting period among output bits from the first stage 440. The second stage 460 receives an output bit from the first stage 440 as a clock and operates as a ripple counter. The third stage 470 receives an output bit from the second stage 460 as a clock and operates as a ripple counter. The fourth stage 480 receives an output bit from the third stage 470 as a clock and operates as a ripple counter.

Since the DDR counter 720 has the same configuration and operation as those of the DDR counter described with reference to FIG. 4, the duplicated descriptions are omitted herein.

Figure 8:
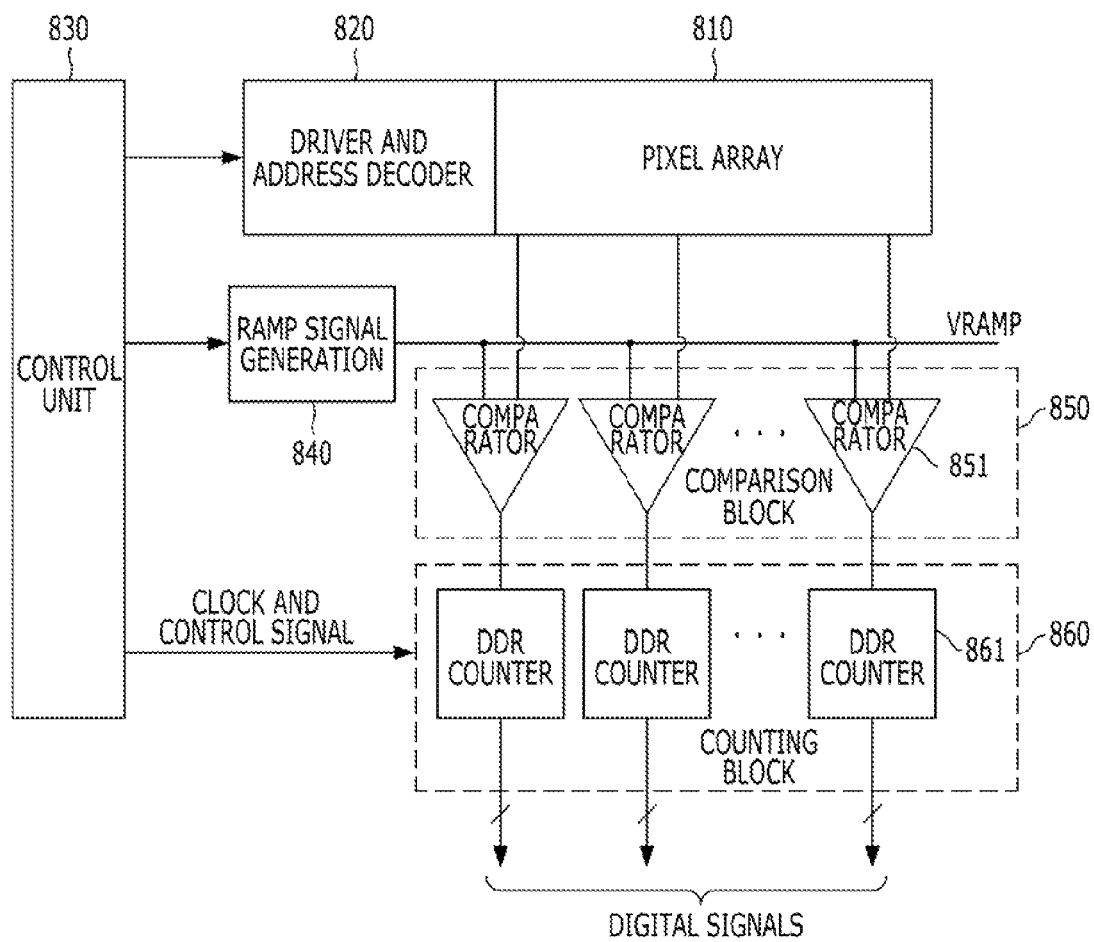
FIG. 8 is a block diagram illustrating a CMOS image sensor in accordance with an embodiment of the present invention.

FIG. 8 is a configuration diagram of a CMOS image sensor in accordance with an embodiment of the present invention.

Referring to FIG. 8, the CMOS image sensor in accordance with the embodiment of the present invention includes a pixel array 810, a driver and address decoder 820, a control unit 830, a ramp signal generation unit 840, a comparison block 850, and a counting block 860.

The pixel array 810 includes a plurality of unit pixels each arranged to convert incident light into an electrical analog signal. The driver and address decoder 820 may control the operation of the pixel array in the unit of row and/or column. The control unit 830 may generate clocks and control signals for controlling operation timings of the respective components of the CMOS image sensor. Here, the clocks and control signals generated from the control unit 830 may include the clock CLK, the counter start signal Count_start, the inversion selection signal COMP_OUT_IVN, and the initialization signal INIT described above.

The analog pixel signal read from the pixel array 810 is converted into a digital signal by an analog-digital converter including the comparison block 850 and the counting block 860. The pixel signal is outputted and processed in the unit of column. For this operation, the comparison block 850 and the counting block 860 may include a plurality of comparators 851 and a plurality of counters 861, respectively, which are provided in the unit of column. As the plurality of signal processing units provided in the unit of column are used to process pixel signals corresponding to one row in parallel at the same time, the CMOS sensor may have an improved performance in terms of band performance or noise and operate at high speed.

The pixel array 810 sequentially outputs a first analog signal indicating a reset component for correlated double sampling and a second analog signal indicating an image signal component. Based on the first and second analog signals, the analog-digital converter including the comparison block 850 and the counting block 860 digitally perform the correlated double sampling, that is, digital double sampling (DDS).

That is, the analog-digital converter counts the first analog signal indicating a reset component, and counts the second analog signal indicating an image signal component. Based on the two counting results, a digital signal corresponding to a difference between the first and second analog signals is generated. The two counting processes are performed according to the above-described DDR counting method.

As the DDR counter 861 having an operating speed two times higher than a general counter is used to perform DDS, the CMOS image sensor may have an improved operating speed and operating margin, and reduce power consumption.

In accordance with the embodiments of the present invention, as the DDR counter is implemented with a simple circuit (for example, a latch), the DDR counter may reduce the power consumption and increase the operating speed more than the conventional DDR counter.

Furthermore, the DDR counter utilizes the second counting clock as the LSB, and determines the state of the second counting clock, which is to be used as the LSB of the counter in the signal counting period based on the last bit state of the LSB in the reset counting period so that counting is continuously performed from the reset counting period to the signal counting period. Thus, the DDS may be realized according to the up counting method. Furthermore, the DDR counter may prevent an error during the DDS process, thereby providing a more precise image signal.

Furthermore, the counter having reduced power consumption and increased operating speed may be used to more efficiently perform analog-digital conversion.

Furthermore, the image sensor including a plurality of counters having an improved performance based on the reduction of power consumption and the increase of operating speed may significantly reduce power consumption, and may increase the operating margin of the image sensor according to the high operating speed of the counter.

Although various embodiments have been described for illustrative purposes, it will be apparent to those skilled in the art that various changes and modifications may be made without departing from the spirit and scope of the invention as defined in the following claims.

What is claimed is:

1. A double data rate (DDR) counter comprising:
a clock selection unit suitable for selectively inverting a first counting clock based on a control signal and for outputting a second counting clock;
a first latch stage suitable for latching the second counting clock based on a counting enable signal and for outputting the least significant bit (LSB) of the DDR counter;
a determination unit suitable for generating the control signal based on the last bit state of the LSB in a reset counting period; and
a second latch stage suitable for receiving the LSB as a clock input to generate a higher bit of the LSB at least in a main counting period.

2. The DDR counter of claim 1, further comprising a counting clock generation unit suitable for generating the first counting clock based on a clock, a counter start signal, and the counting enabling signal.

3. The DDR counter of claim 2, wherein the counting clock generation unit comprises:
an AND gate suitable for performing an AND operation on the clock and the counter start signal; and
a NAND gate suitable for performing a NAND operation on an output signal of the AND gate and the counting enable signal.

4. The DDR counter of claim 2, further comprising an inversion unit suitable for selectively inverting a basic counting period signal in the reset counting period based on an inversion selection signal, and outputting the counting enable signal.

5. The DDR counter of claim 4, wherein the inversion unit comprises:
a switching section suitable for selecting a pass path or an inversion path based on the inversion selection signal; and
an inversion section suitable for inverting the basic counting period when the inversion path is selected by the switching section.

6. The DDR counter of claim 1, further comprising cascaded latch stages,
wherein the second latch stage and the cascaded latch stages, each suitable for receiving an output bit of a previous stage as a clock input and for receiving an output bit thereof as a data input to operate as a ripple counter.

7. The DDR counter of claim 1, wherein the clock selection unit comprises:
a switching section suitable for selecting a pass path or an inversion path based on the control signal; and
an inversion section suitable for inverting the counting clock when the inversion path is selected by the switching section.

8. The DDR counter of claim 1, wherein the first latch stage comprises a latch suitable for latching the second counting clock to output the latched clock as the LSB.

9. The DDR counter of claim 1, wherein the determination unit comprises a latch suitable for latching the last bit state of the LSB in the reset counting period in response to the counting enable signal, and outputting the control signal corresponding to the latched signal.

10. An analog-digital converter comprising:
a comparator suitable for comparing an analog signal with a reference signal and for generating a comparator output signal; and
a DDR counter suitable for performing a counting operation on the comparator output signal based on a clock and for generating a digital signal corresponding to the analog signal,
wherein the DDR counter comprises:
an inversion unit suitable for selectively inverting the comparator output signal in the reset counting period based on an inversion selection signal and for outputting a counting enable signal;
a counting clock generation unit suitable for generating a first counting clock based on the clock, the counting enabling signal, and a counter start signal;
a clock selection unit suitable for selectively inverting the first counting clock based on a control signal and for outputting the second counting clock;

a first latch stage suitable for outputting the second counting clock based on the counting enable signal and for outputting the least significant bit (LSB) of the DDR counter;
a determination unit suitable for generating the control signal based on the last bit state of the LSB in the reset counting period; and
a second latch stage suitable for receiving the LSB as a clock input to generate a higher bit of the LSB at least in a main counting period.

11. The analog-digital converter of claim 10, further comprising cascaded latch stages,
wherein the second latch stage and the cascaded latch stages, each suitable for receiving an output bit of a previous stage as a clock input and for receiving an output bit thereof as a data input to operate as a ripple counter.

12. The analog-digital converter of claim 10, wherein the first stage comprises a latch suitable for latching the second counting clock to output the latched clock as the LSB of the DDR counter.

13. The analog-digital converter of claim 10, wherein the determination unit comprises a latch suitable for latching the last bit state of the LSB in the reset counting period in response to the counting enable signal, and for outputting the control signal corresponding to the latched signal.

14. A CMOS image sensor comprising:
a pixel array suitable for generating an analog signal corresponding to incident light;
a plurality of comparators, each suitable for comparing the analog signal with a ramp signal and for generating a comparator output signal;
a plurality of DDR counters, each suitable for performing a counting operation on the corresponding comparator output signal based on a clock provided from the control unit and for generating a digital signal corresponding to the analog signal; and
a control unit suitable for controlling the operations of the pixel array, the comparators, and DDR counters,
wherein each of the DDR counter comprises:
an inversion unit suitable for selectively inverting the corresponding comparator output signal in the reset counting period based on an inversion selection signal provided from the control unit and for outputting a counting enable signal;
a counting clock generation unit suitable for generating a first counting clock based on the clock, the counting enabling signal, and a counter start signal provided from the control unit;
a clock selection unit suitable for selectively inverting the first counting clock based on a control signal and for outputting the second counting clock;
a first latch stage suitable for outputting the second counting clock on the counting enable signal and for outputting the least significant bit (LSB) of the corresponding DDR counter;
a determination unit suitable for generating the control signal based on the last bit state of the LSB in a reset counting period; and
a second latch stage suitable for receiving the LSB as a clock input to generate a higher bit of the LSB at least in a main counting period.

15. The CMOS image sensor of claim 14, further comprising cascaded latch stages,
wherein the second latch stage and the cascaded latch stages, each suitable for receiving an output bit of a previous stage as a clock input and for receiving an output bit thereof as a data input to operate as a ripple counter.

16. The CMOS image sensor of claim 14, wherein the first stage comprises a latch suitable for latching the second counting clock to output the latched clock as the LSB of the corresponding DDR counter.

17. The CMOS image sensor of claim 14, wherein the determination unit comprises a latch suitable for latching the last bit state of the LSB in the reset counting period and for outputting the control signal corresponding to the latched signal.

* * * * *